(12) United States Patent  
Rauschmayer

(10) Patent No.: US 7,248,549 B2  
(45) Date of Patent: Jul. 24, 2007

(54) SYSTEM FOR LOCKING A CLOCK ONTO THE FREQUENCY OF DATA RECORDED ON A STORAGE MEDIUM

(75) Inventor: Richard Rauschmayer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 538 days.

(21) Appl. No.: 10/903,659

(22) Filed: Jul. 30, 2004

(65) Prior Publication Data

US 2006/0023602 A1 Feb. 2, 2006

(51) Int. Cl.  
*G11B 27/10* (2006.01)

(52) U.S. Cl. ...................... 369/47.28; 360/51

(58) Field of Classification Search .............. None  
See application file for complete search history.

(56) References Cited

U.S. PATENT DOCUMENTS

| | | | | |
|---|---|---|---|---|
| 4,958,243 A * | 9/1990 | Chen et al. ............ | 360/51 |
| 5,193,034 A * | 3/1993 | Tsuyoshi et al. .......... | 360/51 |
| 5,838,512 A * | 11/1998 | Okazaki ............... | 360/51 |
| 6,088,311 A * | 7/2000 | Katoh ............... | 369/47.18 |
| 6,111,712 A * | 8/2000 | Vishakhadatta et al. ...... | 360/51 |
| 6,697,309 B2 * | 2/2004 | De Kimpe et al. ........ | 369/47.3 |
| 6,873,483 B2 * | 3/2005 | Hetzler et al. ........... | 360/51 |
| 6,891,785 B2 * | 5/2005 | Yamamoto et al. ....... | 369/47.28 |
| 2003/0026182 A1 * | 2/2003 | Fischer et al. .......... | 369/47.28 |
| 2003/0198152 A1 * | 10/2003 | Morishima .............. | 369/47.3 |

* cited by examiner

*Primary Examiner*—Thang V. Tran  
(74) *Attorney, Agent, or Firm*—Kinney & Lange, PA

(57) ABSTRACT

A circuit locks onto a frequency of data encoded on a medium, taking frequency variations in the physical travel of the medium into account. The circuit includes a disk locked clock (DLC) circuit having a synthesizer operating under digital control based on a feedback signal to produce a servo reference clock and a read reference clock that track frequency variations in the physical travel of the medium. A recovered clock signal is produced based on the servo reference clock and the read reference clock. A digital phase locked loop maintains a frequency lock of the recovered clock signal. An error measurement circuit is connected to the digital phase locked loop. The error measurement circuit produces the feedback signal for digitally controlling the digital logic circuit synthesizer to produce the servo reference clock and the read reference clock that track frequency variations in the physical travel of the medium.

14 Claims, 3 Drawing Sheets

SYSTEM FOR LOCKING A CLOCK ONTO THE FREQUENCY OF DATA RECORDED ON A STORAGE MEDIUM

BACKGROUND OF THE INVENTION

The present invention relates to an electronic data storage and recovery system, and more particularly to a system for locking a clock onto the frequency of data recorded on a storage medium and tracking or rejecting any frequency variation on the media.

There is a continual desire in the electronic data storage industry to increase the amount of data that can be stored in a given form factor. In order to store a greater amount of data either the density of data storage must be increased or a better use of disk format must be achieved. Increased format efficiency can be achieved by reducing the amount of inter-sector gap (space between adjacent data sectors or space between data sectors and servo wedges). Traditionally, the inter-sector gap space was left on the media to allow for changes in rotational frequency over the life of the product. Typical rotational frequency changes come in the form of non-ideal disk eccentricity, disk slips, or mechanical shocks. Traditional systems do not modulate clocks to account for rotational frequency changes but instead employ a traditional clock recovery scheme, such as circuit 10 shown in FIG. 1.

PLL circuit 10 includes reference clock signal 12, generated by a crystal oscillator, for example, that is input to servo synthesizer/PLL 14 and read synthesizer/PLL 16. Servo synthesizer/PLL 14 receives reference clock signal 12 and is programmed to the nominal servo bit rate. Read synthesizer/PLL 16 receives reference clock signal 12 and is programmed to the nominal read bit rate. Servo synthesizer/PLL 14 produces servo clock signal 18, and read synthesizer/PLL 16 produces a read clock signal. Servo clock signal 18 and the read clock signal are multiplexed together by multiplexer 20, and mixer 22 operates to produce recovered clock signal 24. Digital phase locked loop (DPLL) circuit 26 receives recovered clock signal 24 and incoming data phase error signal 27 to modify mixer 22 to lock onto the incoming servo and read data.

PLL circuits such as circuit 10 shown in FIG. 1 have proved to be excellent circuits for maintaining an accurate data clock in current systems. For better format efficiencies with the written media and to decrease the amount of inter-sector gap required on the media, a system can no longer ignore the rotational frequency variations of the media. It is therefore necessary for a clock circuit with highly accurate "sub-T" error measurement resolution (within a fraction of a clock cycle, where T is a clock cycle period) to be developed for these systems. This allows tracking or rejecting of the rotational frequency variations of the media.

BRIEF SUMMARY OF THE INVENTION

The present invention is a circuit for locking onto a frequency of data encoded on a medium, taking frequency variations in the physical travel of the medium into account. The circuit includes a disk locked clock (DLC) circuit having a synthesizer operating under digital control based on a feedback signal to produce a servo reference clock and a read reference clock that track frequency variations in the physical travel of the medium. A recovered clock signal is produced based on the servo reference clock and the read reference clock. A digital phase locked loop maintains a frequency lock of the recovered clock signal. An error measurement circuit is connected to the digital phase locked loop. The error measurement circuit produces the feedback signal for digitally controlling the digital logic circuit synthesizer to produce the servo reference clock and the read reference clock that track frequency variations in the physical travel of the medium.

DETAILED DESCRIPTION

Figure 1:
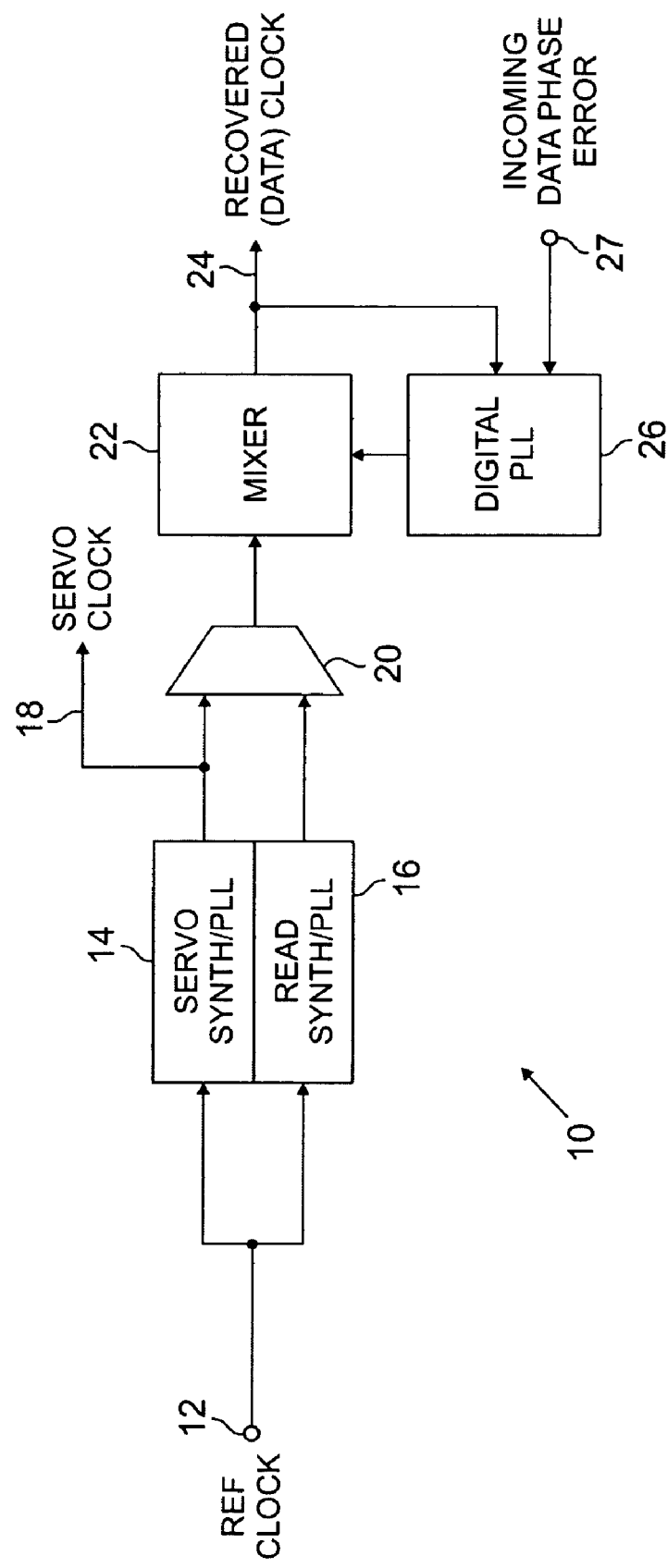
FIG. 1 is a block diagram of a prior art phase locked loop clock circuit.
Figure 2:
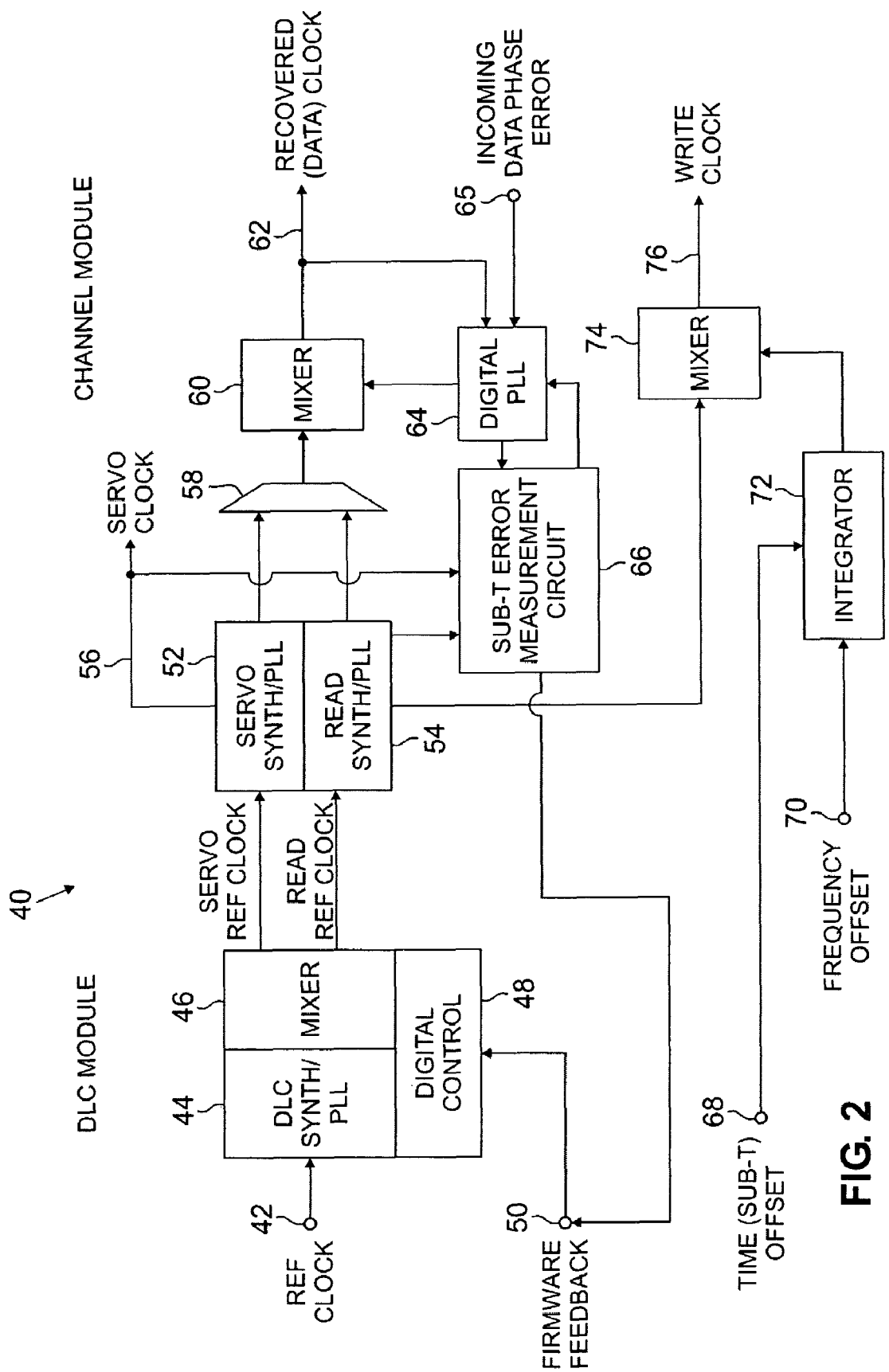
FIG. 2 is a block diagram of a phase locked loop clock circuit with sub-T error measurement resolution according to the present invention.

FIG. 2 is a block diagram of phase locked loop (PLL) clock circuit 40 with sub-T error measurement resolution, in accordance with an embodiment of the present invention. PLL clock circuit 40 includes reference clock signal 42, generated by a crystal oscillator, for example, that is input to a disk locked clock circuit (DLC) module. The DLC module includes DLC synthesizer/PLL 44, mixer 46, and digital control circuit 48. Digital control circuit 48 receives firmware feedback signal 50 to control DLC synthesizer/PLL 44 and mixer 46, so that the servo reference clock and read reference clock outputs of the DLC module are adjusted to track the rotational frequency variation using feedback with sub-T measurement resolution. The nature of firmware feedback signal 50 will be discussed below with respect to FIG. 3.

Servo synthesizer/PLL 52 receives the servo reference clock from the DLC module, which is modulated in frequency to match the rotational frequency variation of the media, to generate servo clock signal 56 that is locked onto the servo frequency of the medium (such as a rotatable disk). Read synthesizer/PLL 54 receives the read reference clock from the DLC module, which is modulated in frequency to match the rotational frequency variation of the media, to generate a read clock signal that is locked onto the frequency of the data encoded on the medium (a disk-locked read clock). The servo clock signal and the read clock signal are multiplexed together by multiplexer 58, and input to mixer 60 which generates recovered clock signal 62 based on the servo and data frequencies. The frequency lock of recovered clock signal 62 is maintained by digital PLL 64, which receives recovered clock signal 62 and incoming data phase erorr signal 65 and adjusts mixer 60 to ensure that recovered clock signal 62 remains locked onto the frequency of the data encoded on the medium.

Digital PLL 64 is also employed, in conjunction with sub-T error measurement circuit 66, to generate firmware feedback signal 50 that controls the operation of the DLC module to make precise adjustments to the servo reference clock and read reference clock signals. The detailed operation of these circuits will be discussed below with respect to FIG. 3.

Figure 3:
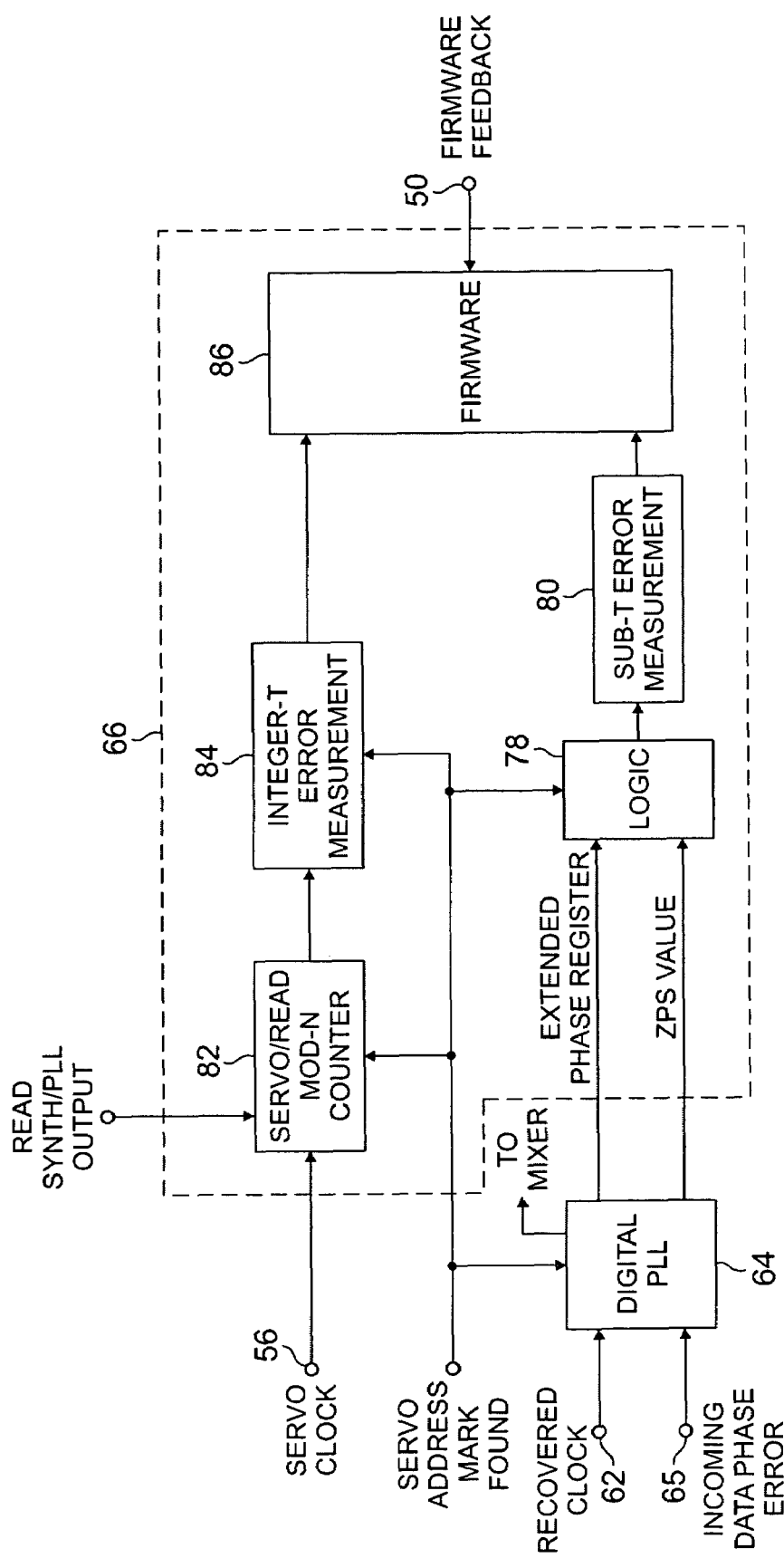
FIG. 3 is a block diagram of a portion of the phase locked loop clock circuit shown in FIG. 2.

The disk-locked read clock signal generated by read synthesizer/PLL 54 is modulated in frequency to match the rotational frequency variation of the media due to the adjustment of the DLC module provided by sub-T error measurement circuit 66 and firmware feedback signal 50 via digital control circuitry 48. This signal can be further adjusted to provide either sub-T time domain offset or frequency domain offset (or both) for writing. Time domain offset is indicated by time offset signal 68, and frequency domain offset is indicated by frequency offset signal 70. These signals are input to integrator circuit 72, the output of which is in turn input to mixer 74 along with the disk-locked clock signal from read synthesizer/PLL 54 to adjust the disk-locked clock signal to produce signal 76 that is the offset adjusted write clock FIG. 3 is a block diagram of a portion of PLL clock circuit 40 shown in FIG. 2. Specifically, FIG. 3 shows the configuration of digital PLL 64 and sub-T error measurement circuit 66 that generates firmware feedback signal 50. Digital PLL 64 receives recovered clock signal 62 and incoming data phase error 65, and is triggered by a signal indicating that a servo address mark has been found. When a servo address mark is found, digital PLL 64 generates a zero phase start (ZPS) signal that, given the known nominal frequency of the medium, indicates the deviation of the phase of the incoming data from the PLL frequency. This deviation is determined over a relatively short sample time, to give an initial phase error signal that accounts for the fact that the sample may begin at any position (phase) of the signal waveform. After the initial ZPS value is determined, digital PLL 64 continues to store information in an extended phase register to record the total amount of adjustment from the nominal frequency that digital PLL 64 has made between successive servo address marks. Digital PLL 64 also provides error information to mixer 60 (FIG. 2), to adjust the frequency of recovered clock signal 62. Logic circuitry 78 receives the output of digital PLL 64, combining the extended phase register information and the ZPS signal information to produce sub-T error measurement 80 of the offset between the servo reference clock and the recovered data clock 62. Sub-T error measurement circuit 66 also performs integer-T adjustment, similar to what has been done previously in the art. Servo/read MOD-N counter 82 receives servo clock signal 56 and the read clock signal output by read synthesizer/PLL 54 (FIG. 2), and performs a counting operation to determine the amount of time, in integer servo clock T and integer read clock T, between successive servo address marks. This integer-T error measurement 84, along with sub-T error measurement 80 of the offset between the servo reference clock and the recovered data clock 62, is used by firmware 86 to provide feedback signal 50 to precisely track or reject the rotational frequency variation of the media. Specifically, firmware feedback 50, based on the integer-T and sub-T error signals, controls the DLC module (FIG. 2) that produces servo and read reference clocks. These reference clocks can therefore be generated to precisely track or reject the rotational frequency variation of the media due to the sub-T measurement capability provided by sub-T error measurement circuit 66.

The present invention provides the ability to precisely track or reject the rotational frequency variation of the media with a degree of accuracy which has not previously been possible in existing phase locked loop circuitry. A disk locked clock circuit (DLC) module is provided, under digital control, to generate a servo reference clock and a read reference clock that track rotational frequency variations of the media. A recovered clock signal is produced that is based on the servo reference clock and the read reference clock. A digital phase locked loop receives the recovered clock signal and an incoming data phase error signal, and measures sub-T (within a fraction of a clock cycle) offset between the reference clock and the recovered clock. Firmware processes the sub-T phase information and integer-T information together to provide a feedback signal for digitally controlling the DLC module, so that the DLC module outputs are adjusted to precisely track or reject the rotational frequency variation of the media. As a result, the overall circuit is able to lock onto servo and data frequencies and track or reject typical rotational frequency changes in disk drives due to non-ideal disk eccentricity, disk slips, mechanical shocks, and other outside sources.

The sub-T error measurement resolution of the clock signals provided by the present invention also permit sub-T time domain offset of a write clock, in addition to (or instead of) the frequency offset of the write clock that was available in prior systems.

Although the present invention has been described with reference to preferred embodiments, workers skilled in the art will recognize that changes may be made in form and detail without departing from the spirit and scope of the invention. For example, although medium-based frequency variations have been described with respect to rotational characteristics of disk drives, it should be understood that the present invention has application to physical travel variations of any appropriate medium.

The invention claimed is:

1. A circuit for locking onto a frequency of data encoded on a medium, comprising:
   a disk locked clock circuit comprising a synthesizer operating under digital control based on a feedback signal to produce a servo reference clock and a read reference clock that track frequency variations in the physical travel of the medium;
   synthesizing and mixing circuitry for receiving the servo reference clock and the read reference clock and producing a recovered clock signal;
   a digital phase locked loop connected to the synthesizing and mixing circuitry for maintaining a frequency lock of the recovered clock signal; and
   an error measurement circuit connected to the digital phase locked loop for providing the feedback signal for digitally controlling the disk locked clock synthesizer to produce the servo reference clock and the read reference clock that track frequency variations in the physical travel of the medium.

2. The circuit of claim 1, wherein the synthesizing and mixing circuitry comprises:
   a servo synthesizer receiving the servo reference clock and producing a servo clock that is locked onto a frequency of servo address marks on the medium;
   a read synthesizer receiving the read reference clock and producing a read clock that is locked onto the frequency of data encoded on the medium; and
   a first mixer for producing the recovered clock signal based on the servo clock and the read clock;
   wherein the digital phase locked loop is connected to the first mixer for maintaining the frequency lock of the recovered clock signal.

3. The circuit of claim 2, further comprising a write clock adjustment circuit comprising:
   an integrator that receives a time domain offset signal and a frequency offset signal and produces an offset signal representing a desired time and frequency write offset; and
   a second mixer receiving the read clock signal from the read synthesizer and the offset signal from the integrator, and producing a write clock signal incorporating the desired time and frequency write offset.

4. The circuit of claim 1, wherein the error adjustment circuit comprises:

first circuitry for generating a fine error measurement;
second circuitry for generating a coarse error measurement; and
firmware for processing the fine error measurement and the coarse error measurement to produce the feedback signal for digitally controlling the disk locked clock synthesizer to produce the servo reference clock and the read reference clock that track frequency variations in the physical travel of the medium.

5. The circuit of claim 4, wherein the digital phase locked loop produces a zero phase start (ZPS) value and extended phase register information representing a deviation of the recovered clock signal frequency from a nominal frequency between successive servo address marks on the medium, and wherein the first circuitry comprises a logic circuit for combining the ZPS value and the extended phase register information to produce the fine error measurement indicating a difference between the servo reference clock frequency and the recovered clock signal frequency.

6. The circuit of claim 4, wherein the second circuitry comprises a counter for counting a number of servo clock periods and read clock periods occurring between successive servo address marks on the medium and for producing the coarse error measurement based on the number of servo clock periods and read clock periods counted.

7. A method of locking onto a frequency of data encoded on a medium, taking frequency variations in the physical travel of the medium into account, comprising:
producing a servo reference clock and a read reference clock that, based on a feedback signal, track frequency variations in the physical travel of the medium;
producing a recovered clock signal based on the servo reference clock and the read reference clock; and
making a fine resolution error measurement, with a digital phase locked loop, between the recovered clock signal frequency and the servo reference clock frequency, the fine error measurement being used to create the feedback signal.

8. The method of claim 7, wherein producing the recovered clock signal based on the servo reference clock and the read reference clock comprises:
producing a servo clock based on the servo reference clock that is locked onto a frequency of servo address marks on the medium;
producing a read clock based on the read reference clock that is locked onto a frequency of data encoded on the medium; and
producing the recovered clock signal based on the servo clock and the read clock.

9. The method of claim 8, further comprising producing an offset write clock by:
providing a time domain offset signal representing a desired time domain write offset; and
adjusting the read clock with the time domain write offset signal to produce the offset write clock.

10. The method of claim 7, further comprising:
making a coarse resolution error measurement; and
processing the fine resolution error measurement and the coarse resolution error measurement to produce the feedback signal for tracking frequency variations in the physical travel of the medium.

11. The method of claim 10, wherein making the coarse error measurement comprises:
counting a number of servo clock periods and read clock periods occurring between successive servo address marks on the medium to produce the coarse error measurement based on the number of servo clock periods and read clock periods counted.

12. The method of claim 7, wherein making the fine error measurement comprises:
producing a zero phase start (ZPS) value and extended phase register information representing a deviation of the recovered clock signal frequency from a nominal frequency between successive servo address marks on the medium.

13. A method of producing an offset write clock for writing data on a medium, comprising:
producing a read clock locked onto a frequency of data encoded on the medium;
providing a time domain offset signal representing a desired time domain write offset; and
adjusting the read clock with the time domain write offset signal to produce the offset write clock.

14. The method of claim 13, further comprising:
providing a frequency domain offset signal representing a desired frequency domain write offset;
combining the time domain offset signal and the frequency domain offset signal to produce an integrated offset signal; and
adjusting the read clock with the integrated offset signal to produce the offset write clock.

* * * * *